United States Patent
Salling et al.

(10) Patent No.: US 6,875,650 B2
(45) Date of Patent: Apr. 5, 2005

(54) ELIMINATING SUBSTRATE NOISE BY AN ELECTRICALLY ISOLATED HIGH-VOLTAGE I/O TRANSISTOR

(75) Inventors: Craig T. Salling, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 10/684,948

(22) Filed: Oct. 14, 2003

(65) Prior Publication Data

US 2004/0082133 A1 Apr. 29, 2004

Related U.S. Application Data

(62) Division of application No. 10/051,962, filed on Jan. 16, 2002, now abandoned.

(51) Int. Cl.[7] .................. H01L 21/8238; H01L 21/336; H01L 21/425
(52) U.S. Cl. ....................... 438/224; 438/228; 438/282; 438/526
(58) Field of Search ................................ 438/228, 224, 438/207, 217, 226, 282, 526; 257/544, 339

(56) References Cited

U.S. PATENT DOCUMENTS

| | | | |
|---|---|---|---|
| 4,927,776 A | * | 5/1990 | Soejima ..................... 438/207 |
| 4,951,117 A | * | 8/1990 | Kasai ......................... 257/334 |
| 4,994,888 A | | 2/1991 | Taguchi et al. |
| 5,185,649 A | * | 2/1993 | Bertotti et al. .............. 257/547 |
| 5,218,228 A | | 6/1993 | Williams et al. |
| 5,340,762 A | | 8/1994 | Vora |
| 5,489,540 A | | 2/1996 | Liu et al. |
| 5,583,061 A | | 12/1996 | Williams et al. |
| 5,648,281 A | * | 7/1997 | Williams et al. ........... 438/358 |
| 5,677,209 A | * | 10/1997 | Shon et al. ................. 438/363 |
| 5,851,864 A | | 12/1998 | Ito et al. |
| 5,877,049 A | * | 3/1999 | Liu et al. .................... 438/224 |
| 6,211,003 B1 | * | 4/2001 | Taniguchi et al. .......... 438/228 |
| 6,424,007 B1 | * | 7/2002 | Disney ....................... 257/342 |
| 6,727,573 B2 | * | 4/2004 | Mitani et al. ............... 257/544 |

* cited by examiner

Primary Examiner—Stacy A. Whitmore
Assistant Examiner—Ron Pompey
(74) Attorney, Agent, or Firm—W. James Brady, III; Frederick J. Telecky, Jr.

(57) ABSTRACT

On the surface of a semiconductor material of a first conductivity type 101a, a lateral MOS transistor 100 is described surrounded by a well 171 of the opposite conductivity type and, nested within the well, an electrical isolation region 102. The semiconductor region 101a embedding this transistor has a resistivity higher than the remainder of the semiconductor material 101 and further contains a buried layer 160 of the opposite conductivity type. This layer 160 extends laterally to the wells 171, thereby electrically isolating the near-surface portion of the semiconductor region from the remainder of the semiconductor material, and enabling the MOS transistor to operate as an electrically isolated high-voltage I/O transistor for circuit noise reduction, while having low drain junction capacitance.

In the first embodiment of the invention (FIG. 1), the buried layer 171 extends vertically deeper from the surface than the electrical isolation region 102, thereby enabling a separate contact 106 to the electrically isolated near-surface portion 101a of the semiconductor region.

25 Claims, 4 Drawing Sheets

ELIMINATING SUBSTRATE NOISE BY AN ELECTRICALLY ISOLATED HIGH-VOLTAGE I/O TRANSISTOR

CROSS-REFERENCE TO RELATED APPLICATIONS

This application is a divisional of U.S patent application Ser. No. 10/051,962 filed Jan. 16, 2002, now abandoned.

FIELD OF THE INVENTION

The present invention is related in general to the field of electronic systems and semiconductor devices, and more specifically to structures and fabrication methods for an electrically isolated high-voltage transistor operable to eliminate substrate noise.

DESCRIPTION OF THE RELATED ART

In mixed-signal integrated circuits (ICs), analog circuits are designed on the same semiconductor chip together with digital circuits. Consequently, since analog circuits share the same substrate with high-speed digital circuits, electrical noise created by the high-speed operation is coupled between the circuits and may affect the performance of the analog circuits. As the frequency of the operational digital circuit increases, and transistor dimensions are reduced, the effect of the noise coupling is becoming more and more serious.

A recent study of the substrate noise and several types of guard rings designed for noise rejection, has been published by Hwan-Mei Cheng et al. ("A Study of Substrate Noise and Noise-rejection-efficiency of Guard-ring in Monolithic Integrated Circuits", IEEE Trans. 2000, pp.123–128). Unfortunately, the proposed substrate noise remedies include designs requiring additional silicon real estate area, or additional photomask steps. The costs connected with these additional design and fabrication steps make them economically unattractive.

An urgent need has, therefore, arisen for a coherent, low-cost method of blocking substrate noise in mixed-signal ICs. The method should further enhance IC electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

On the surface of a semiconductor material of a first conductivity type, a lateral MOS transistor is described surrounded by a well of the opposite conductivity type and, nested within the well, an electrical isolation region. The semiconductor region embedding this transistor has a resistivity higher than the remainder of the semiconductor material and further contains a buried layer of the opposite conductivity type. This layer extends laterally to the wells, thereby electrically isolating the near-surface portion of the semiconductor region from the remainder of the semiconductor material, and enabling the MOS transistor to operate as an electrically isolated high-voltage I/O transistor for circuit noise reduction, while having low drain junction capacitance.

It is a technical advantage of the present invention that there are several options for designing the buried layer and the electrical contact to the resulting isolated base of the MOS transistor:

In the first embodiment of the invention, the buried layer extends vertically deeper from the surface than the electrical isolation region, thereby enabling a separate contact to the electrically isolated near-surface portion of the semiconductor region.

In the second embodiment of the invention, the buried layer extends vertically from the surface not as deep as the electrical isolation region, thereby enabling contacts to the electrically isolated near-surface portion of the semiconductor region in the shape of a body-tied source. This body-tied source is configured to provide a dual-function contact region to the MOS transistor source, and to the electrically isolated near-surface portion of the semiconductor region.

In the third embodiment of the invention, the buried layer extends vertically from the surface not as deep as the electrical isolation region, thereby enabling contacts to the electrically isolated near-surface portion of the semiconductor region in the shape of an angular-structured gate of the MOS transistor. This angular-structured gate is configured to include an H-shape or a T-shape such that its directly adjacent regions provide contacts to the source, drain, and near-surface portion of the semiconductor region.

It is an essential aspect of the invention to use the photomask step, which is needed for implanting the low energy ions in order to create the extended source and drain, for the additional process step of implanting at high energy and high dose the ions needed to create the buried layer. This economical feature renders the additional high-energy ion implant step and thus the formation of an electrically isolated high-voltage I/O transistor exceedingly inexpensive.

Another aspect of the invention is that the high energy/high dose ion implant step transforms the electrically isolated region of the first conductivity type into a region of higher resistivity compared to the remainder of the semiconductor material of the first conductivity type.

The present invention is equally applicable to nMOS and pMOS transistors; the conductivity types of the semiconductor and the ion implant types are simply reversed.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 60/263,619, filed on Jan. 23, 2001 (Salling et al., "Structure and Method of MOS transistor having Increased Substrate Resistance").

In a typical integrated circuit (IC), an output buffer drives the voltage on an output pad (I/O pad) by one or more pMOS transistors connected between pad and positive power supply voltage bus, and one or more nMOS transistors connected between pad and ground. There are several reasons why it is desirable to electrically isolate an output buffer's nMOS transistors from the substrate.

When the large output nMOS transistors of an output switch are in operation, they generate substrate current pulses due to hole generation at the drain junction, and capacitive displacement currents at the drain junction's parasitic capacitance to the substrate. This substrate current constitutes noise for any sensitive, low-noise analog inputs integrated on the same chip.

The substrate hole current can also cause latch-up.

Another source of substrate current occurs when the pad of an output buffer transits to a negative voltage during some transient. For example, this may be caused by an undershoot of the output buffer, or by a transient on incoming signals in a bi-directional pad (input+output pad). This substrate electron current can cause latch-up, and it may cause noise on analog inputs.

Figure 4:
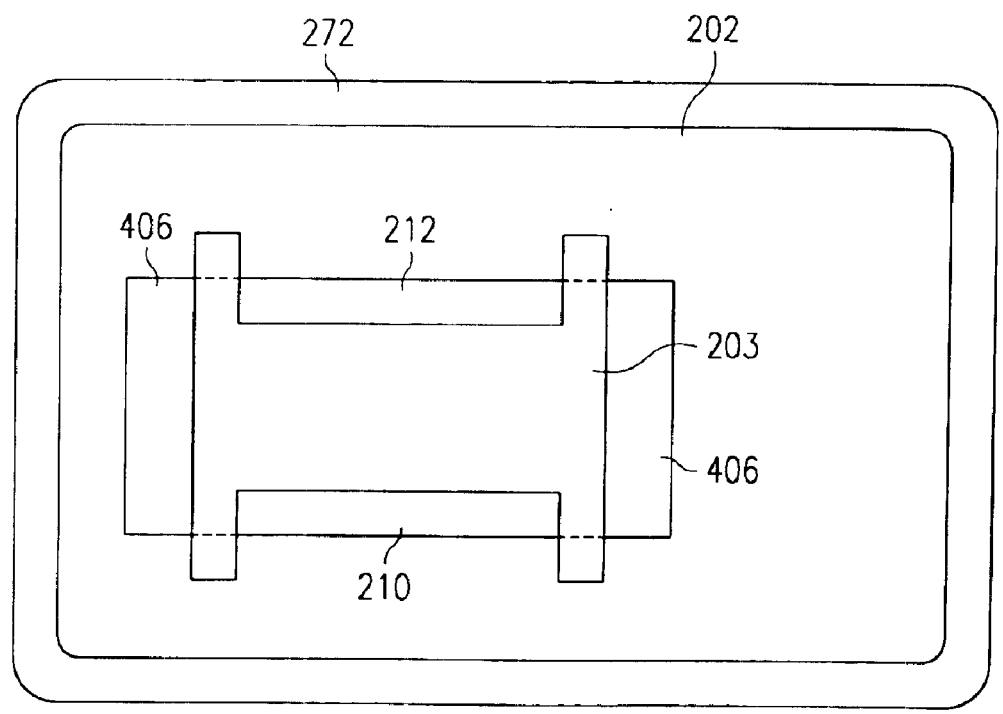
FIG. 4 is a schematic top view of the electrically isolated nMOS transistor according to the third embodiment of the invention, depicting the gate in H-form in order to provide contact to the isolated p-well (body contact).
Figure 5:
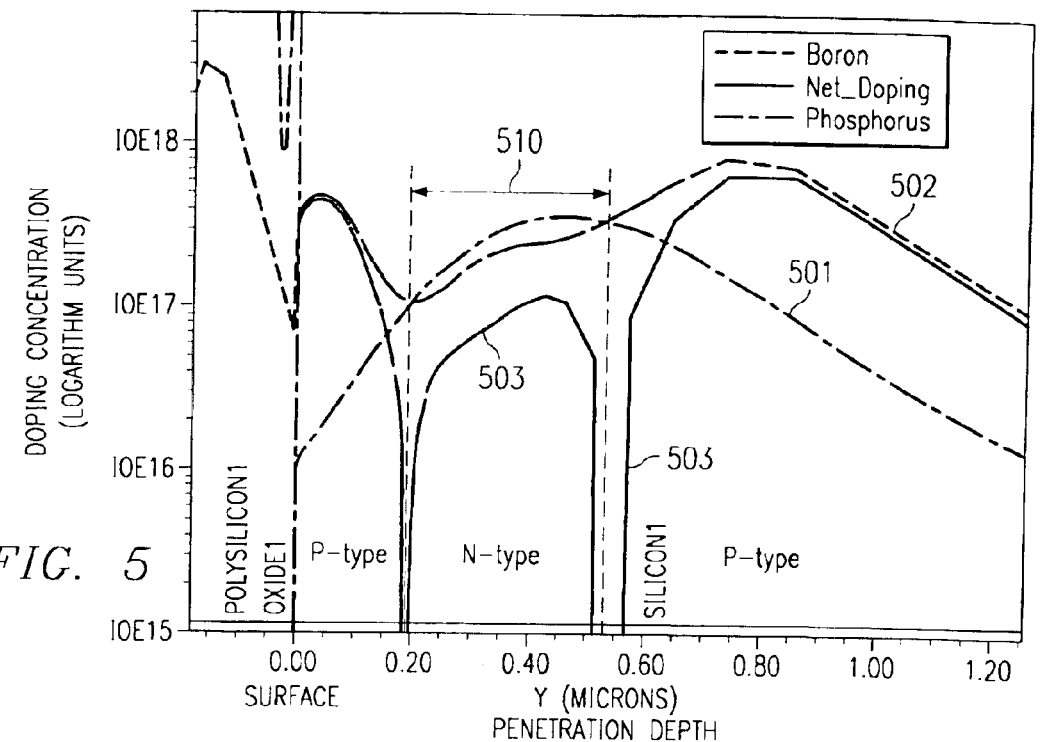
FIG. 5 is an example of a plot of the doping profiles under the gate of an nMOS transistor before and after the high-energy n-type implant according to the second and third embodiments of the invention.

It is cumbersome in conventional technology to achieve the desirable electrical isolation of the nMOS transistors because of the requirement of an additional photomask step. The invention eliminates this hurdle. FIGS. 1, 2, 3, and 4 show the resulting embodiments of IC structures according to the invention, and FIG. 5 gives an example of a doping profile under the transistor gate illustrating the method to accomplish the desired electrical isolation of the nMOS transistor. While the examples depicted embody the experimental conditions for an nMOS transistor, analogous considerations hold for the conditions of a PMOS transistor.

Figure 1:
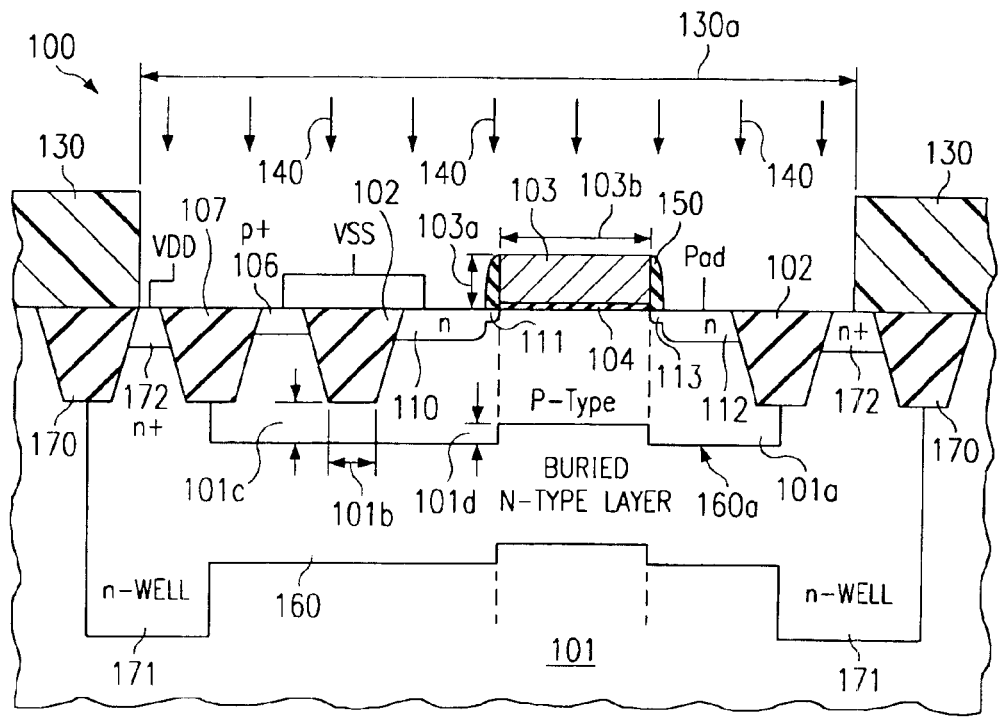
FIG. 1 is a schematic cross section of an electrically isolated high voltage I/O nMOS transistor as provided by the first embodiment of the invention.

FIG. 1 shows in simplified and schematic (not to scale) manner a small portion of an IC, generally designated 100, having on its surface a high-voltage I/O MOS transistor isolated by a buried layer. The invention applies to nMOS as well as pMOS transistors fabricated into semiconductor material 101, often referred to as the substrate. Here, the substrate may comprise a p-type semiconductor wafer, onto which, for some devices, an epitaxial layer, also of p-type doping, has been deposited. (For clarity, the description and discussion of the invention will be for a p-type semiconductor as the "first" conductivity type. However, the invention is also applicable, if an n-type substrate is used as the first conductivity type material). The semiconductor material may be silicon, silicon germanium, gallium arsenide or any other semiconductor material used in IC fabrication.

The resistivity of the semiconductor substrate 101, into which the MOS transistor is fabricated, ranges from about 1 to 50 Ωcm (this is also the resistivity of the epitaxial layer). Frequently, the material close to the MOS transistor may be generated as a well of the first conductivity type, in the example of FIG. 1 a p-well.

A silicon dioxide isolation trench 102 (preferably 350 nm deep) has been created to surround the lateral MOS transistor; it defines the active area of the lateral transistor. For the gate 103 of the MOS transistor, poly-silicon or another conductive material is usually chosen; its thickness 103a is commonly between 140 and 180 nm, and the width 103b between 0.2 and 1.0 μm. The gate insulator 104 (silicon dioxide, nitrided SiO2, or others) has a physical thickness between 1 and 10 nm.

FIG. 1 shows an additional silicon dioxide isolation trench 170, which defines the lateral extent of the deep well 171 on the surface. This well is of the conductivity type opposite to the "first" conductivity type; in the example of FIG. 1, well 171 is an n-well; it is contacted by n+-region 172. The n-well completely surrounds the nMOS transistor, and it is reaches deep from the surface into the semiconductor material 101 of the first conductivity type (p-type in FIG. 1).

FIG. 1 shows a deep source 110 and an extended source 111, further a deep drain 112 and an extended drain 113. The extended source and drain are prepared by low-energy, shallow implants (depth typically between 25 and 40 nm), the deep source and drain by medium-energy implants (depth typically between 100 and 140 nm) as part of the process flow discussed later. For the fabrication by ion implantation, a window 130a in a photoresist layer 130 is used; window 130a determines the lateral extent and active area of the MOS transistor.

The same photoresist and window are used for the high-energy and high dose implant 140 of the present invention. This implant is performed for creating the buried layer 160 within the opening of window 130a. In FIG. 1, buried layer 160 is n-type. As further consequence of the high energy ion implant 140, the p-type semiconductor material portion 101a between surface and the buried layer 160 acquires a resistivity higher than the resistivity of the remainder 101 of the p-type semiconductor material.

Laterally, buried layer 160 extends to the n-well 171. Consequently, the buried layer electrically isolates the near-surface portion 101a of the p-type material from the remainder 101 of the semiconductor material. The nMOS transistor is completely positioned within this isolated portion 101a and is thus an electrically isolated transistor, operable as a high-voltage I/O transistor which does not create substrate noise for the IC. Due to the partially counterdoped p-type regions under source and drain, the transistor has low drain junction capacitance.

Vertically, the position of the buried layer 160 relative to the surface depends on the energy of the implanted ions. In the first embodiment of the invention, which is depicted in FIG. 1, the buried layer edge 160a nearest the surface is deeper, i.e. farther away, from the surface than the bottom of the electrical isolation regions 102. This fact results in an electrically isolated p-type region 101a continuous under one portion of isolation region 102; this connecting portion is marked 101b in FIG. 1. The thickness 101c of the connecting portion is a function of the energy of the implanted n-type ions.

This continuity feature, in turn, enables a separate p+-contact 106 to the electrically isolated near-surface portion 101a of the p-type semiconductor region. The geometrical extent of the contact region 106 is limited by an additional isolation region 107, which simultaneously serves as one of the limiting "markers" for n-well 171.

It may be mentioned that the thickness of the photoresist layer 130 is larger than the thickness solely required to block the lower energy implants. Preferably, the photoresist layer thickness is between 1.5 and 2.0 µm. If the high-energy implant accompanies the medium-energy implant, non-conductive sidewalls 150 are typically present as part of the gate structure.

For nMOS transistors, the semiconductor of the first conductivity type (p-type) (including any epitaxial layer) has dopant species selected from a group consisting of boron, aluminum, gallium, and indium. Source, drain, their extensions, and the buried layer within the semiconductor of the first conductivity type have a dopant species selected from a group consisting of arsenic, phosphorus, antimony, and bismuth.

For PMOS transistors, the semiconductor of the first conductivity type (n-type) has dopant species selected from a group consisting of arsenic, phosphorus, antimony, and bismuth. Source, drain, their extensions, and the buried layer within the semiconductor of the first conductivity type have a dopant species selected from a group consisting of boron, aluminum, gallium, indium, and lithium.

As a consequence of the fabrication process flow, the isolated p-type region 101a is shallower under the poly gate 103 by a measurable distance 101d. The thickness of distance 101c depends on the energy of the implanted n-type ions. Further, the net n-type doping of the buried layer 160 is slightly higher under the poly gate and can be measured by imaging the 2-dimensional profile of the buried n-type layer, for instance by using a 2-dimensional SIMS technique after cleaving and diode-etching the sample.

As for electrical circuit connections, drain 112 is connected to the I/O pad as the high voltage contact, source 110 is connected to body contact 106 and both to Vss or ground, and n-well contact 172 (and thus the buried layer 160) to Vdd.

Figure 2:
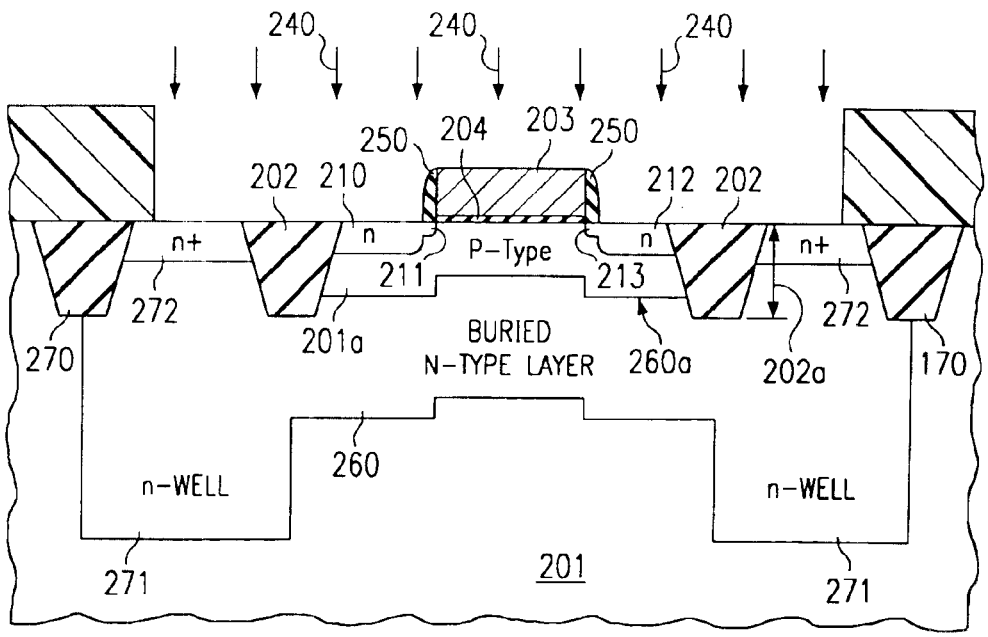
FIG. 2 is a schematic cross section of an electrically isolated high voltage I/O nMOS transistor as Provided by the second and third embodiments of the invention.
Figure 3:
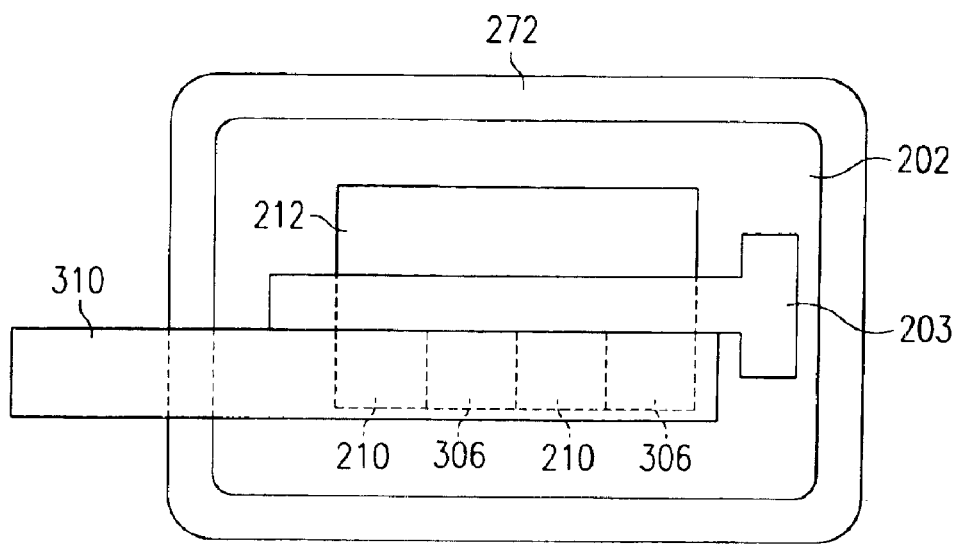
FIG. 3 is a schematic top view of the electrically isolated MOS transistor according to the second embodiment of the invention, depicting the source contact in the form of a body-tied-contact (alternating p-n-p-n doped regions).

The schematic cross section of FIG. 2 illustrates the buried layer for the second and third embodiments of the invention. The main difference compared to the structure depicted in FIG. 1 is the reduced vertical depth of the buried layer 260 from the semiconductor surface, brought about by a reduced energy of the implanted n-type ions 240. Since the depth 202a of the isolation trench 202 is preferably 350 nm, the buried layer edge 260a is less than 350 nm away from the surface. The buried layer 260, however, still extends laterally to the n-well 271 (which is contacted by n+-region 272).

Consequently, the embodiment of FIG. 2 does no longer exhibit a continuity of the isolated p-type region 201a beyond the isolation trench 202. The constraint of isolated region 201a necessitates specific means to establish the electrical contact to isolated region 201a. The specific means is provided by specific structures of source 210 of the MOS transistor.

In the example of FIG. 2, the nMOS transistor consists of source 210 with 211, drain 212 with 213, gate 203, and gate insulation 204.

In the second embodiment of the invention, the electrical contact to the isolated region 201a is provided by the design of source 210 as a "body-tied source". The structure of this body-tied-to-source is schematically illustrated in the top view of the transistor in FIG. 3. Equal numbers refer to equal entities in FIGS. 2 and 3. The n+ contact 272 to the n-well (and thus the buried n-type layer) completely surrounds the nMOS transistor; n+ contact 272 is electrically connected to Vdd. Nested within the n+ contact is the shallow trench isolation 202. Gate 203 of the nMOS transistor may be designed in a variety of different shapes convenient for layout and electrical connections. N+-type drain contact region 212 is electrically connected to the I/O pad as the high voltage contact. The (n+-type) source contact regions 210 alternate laterally with the (p+-type) body contact regions 306 (not shown in FIG. 2). Overlaid metal contact layer 310 joins the electrical contacts to source and body and provides the electrical connection to Vss.

In the third embodiment of the invention, the electrical contact to the isolated region 201a (the body) is provided by a design practiced in the silicon-on-insulator technology: The gate is structured in an "H"-shape or a "T"-shape. An example is illustrated in the schematic top view of FIG. 4 for an H-shaped gate of an nMOS transistor. Equal numbers refer to equal entities in FIGS. 2 and 4. The n+ contact 272 to the n-well (and thus the buried n-type layer) completely surrounds the nMOS transistor; n+ contact 272 is electrically connected to Vdd. Nested within the n+ contact is the shallow trench isolation 202. Gate 203 of the nMOS transistor may be designed in a variety of different shapes such as H-shape (as Shown in FIG. 4) or T-shape. N+-type drain contact region 212 is electrically connected to the I/O pad as the high voltage contact. N+-type source contact region 210 is connected to Vss. P+-type body contacts 406 are also connected to Vss.

By way of example for an nMOS transistor as shown in FIG. 2, FIG. 5 depicts the computer-generated doping profiles under the gate, as resulting from the high-energy n-doping implant of the present invention. The ordinate plots the doping concentrations on logarithmic scale, and the abscissa shows the penetration depths into the semiconductor surface, expressed in µm. FIG. 5 shows the starting boron concentration (curve 502) and the implanted phosphorus concentration (curve 501). as needed for creating the buried n-type layer at a depth as illustrated in FIG. 2. Further, the resulting net doping is illustrated (curve 503). The phosphorus implant is selected at the energy of 500 keV at the dose of 2.0 E13 cm−2. This creates the buried n-type layer as depicted in FIG. 2, with the peak penetration is somewhat less deep under the surface than in FIG. 1 (an energy of about 675 keV at the same dose of 2.0E13 cm−2 is needed for the penetration of FIG. 1). In the region 510, stretching approximately from 0.19 µm to 0.53 µm depth, the phosphorus doping overcompensates the boron doping (curve 502), leading to the buried n-type region embedded within the p-type semiconductor material.

Figure 6A:
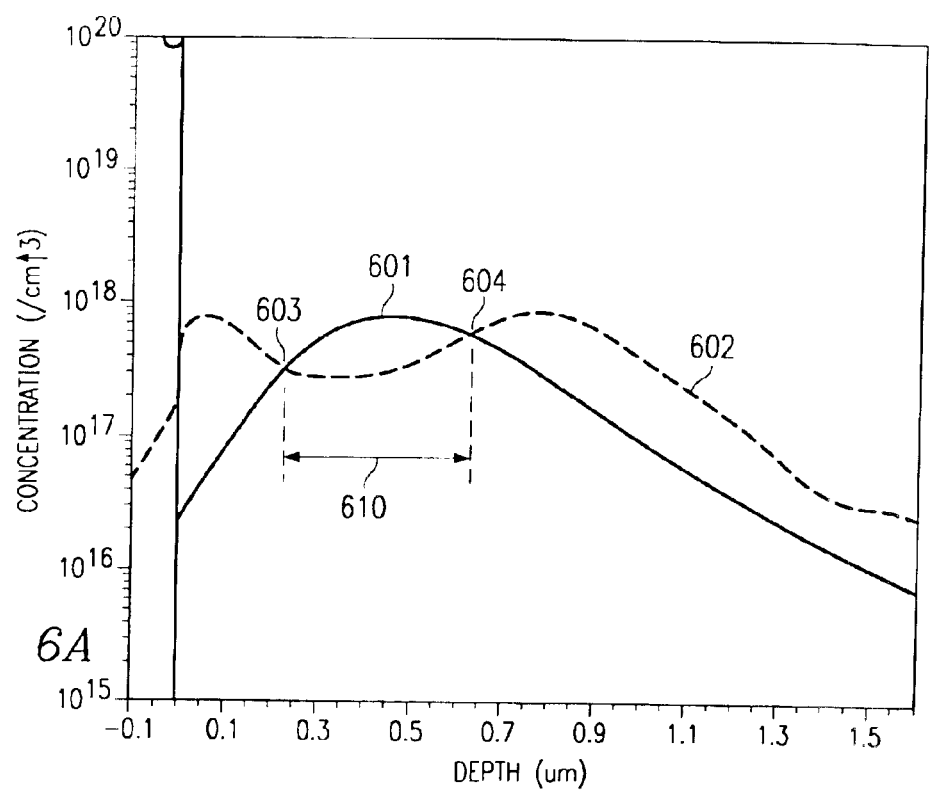
FIG. 6A plots the computer-generated doping profiles under the gate of an nMOS transistor after a high-energy n-type and p-type implants according to the invention.
Figure 6B:
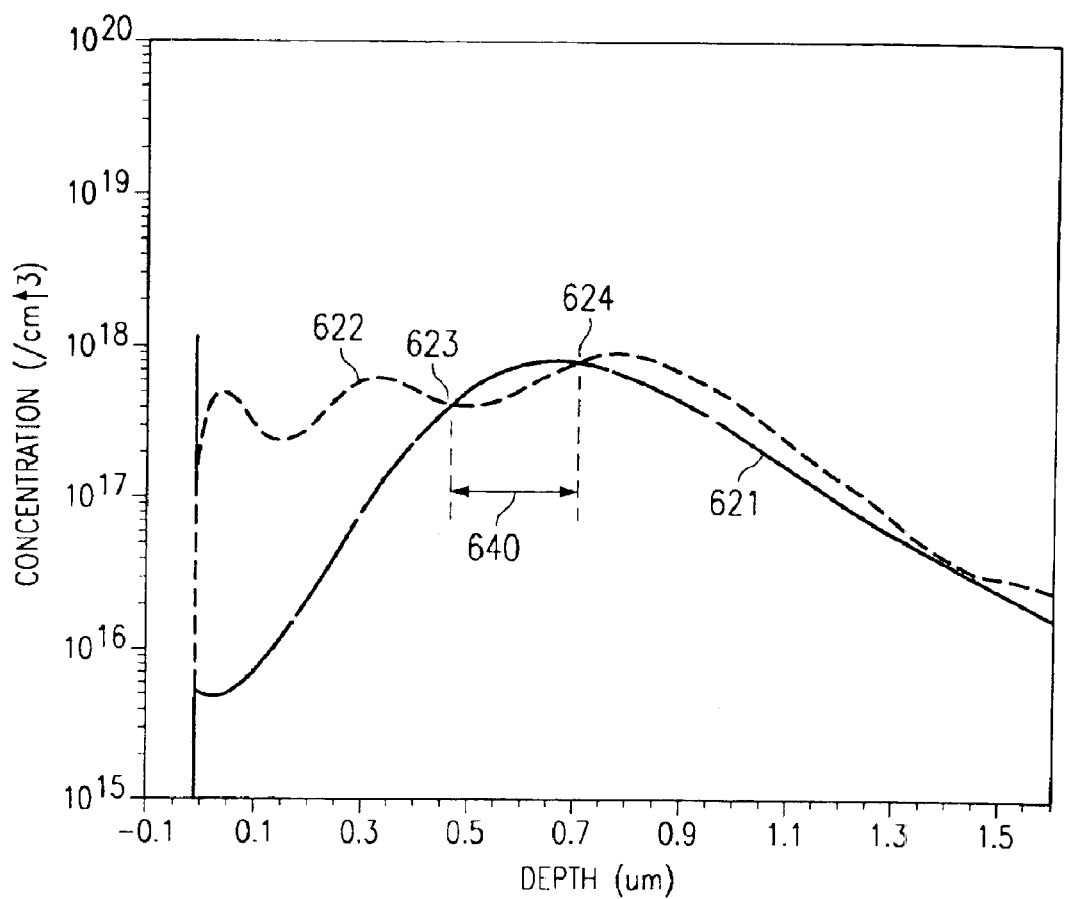
FIG. 6B plots the computer-generated doping profiles under source and drain of an nMOS transistor after a high-energy n-type and p-type implants according to the invention.

A computer simulation of a similar preferred ion implant condition for creating the buried layer is displayed for the conditions of:

phosphorus implant energy 500 keV, dose 4·10E13;

boron implant energy 100 keV, dose 1·10E13. FIG. 6A plots the resulting doping concentrations under the gate, and FIG. 6B plots the concentrations under source and drain. In both figures, a junction has been created where the phosphorus doping curves intersect with the boron implant curves. In FIG. 6A, phosphorus doping curve 601 intersects with boron doping curve 602 at points 603 and 604. In the region 610, stretching approximately from 0.22 to 0.62 µm depth, the phosphorus doping overcompensates the boron doping, leading to the buried n-type region embedded within the p-type semiconductor material. In FIG. 6B, phosphorus doping curve 621 intersects with boron doping curve 622 at points 623 and 624. In region 640, stretching approximately from 0.45 µm to 0.68 µm depth, the phosphorus doping overcompensates the boron doping, leading to the buried n-type region.

Figure 7:
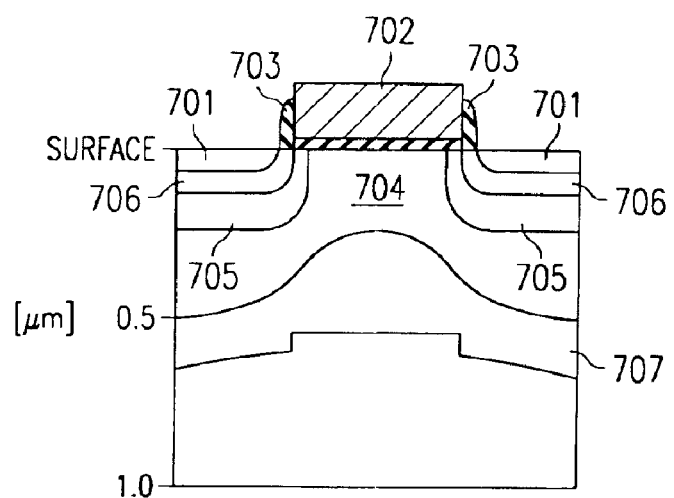
FIG. 7 shows the cross section of an nMOS transistor with the computer-generated conductivity regions after a high-energy n-type and p-type implants according to the invention.

In summary, it can be seen that the buried layer continues from the region under the gate to the regions under source and drain, until the buried layer merges with the n-wells. There is a slight shift in depth, as indicated schematically in FIGS. 1 and 2 and more realistically by the computer simulations in FIG. 7. The nMOS transistor cross section of FIG. 7 shows above the semiconductor surface 701 the gate 702 and the non-conductive side-walls 703, and under the surface the buried p-type region 704, the n-type source 705 and drain 706, and the buried n-layer 707. Buried layer 707 has been created by the high-energy n-type ion implant according to the invention; it stretches closer to the surface (and is thicker) under the gate 702, but is continuous from source to drain where it connects to the n-wells (not shown in FIG. 7).

It is a technical advantage of the present invention that the location, peak and depth of the buried layer can be precisely controlled by employing a high-energy, low-dose implant of p-doping ions in conjunction with the high-energy n-doping implant. In the preferred embodiment, the ion energy is between 70 and 140 keV, and the dose between 5·10E12 to 5·10E13. The effect of such implant can readily be deduced from FIGS. 6A, 6B and 7.

The method of fabricating a buried n-type layer connecting two n-wells in a p-type semiconductor surface region having an increased resistivity relative to a p-type semiconductor sub-surface region comprises the following process steps (analogous process steps apply for the fabrication of a buried p-type layer):

depositing a photoresist layer over the surface of the p-type semiconductor sub-surface region, and opening a window in the layer over the surface region between the n-wells; and implanting, at high energy (about 400 to 700 keV) and high dose (about 8·10E12 to 8·10E13 cm−2), n-type ions into the p-type semiconductor through the window, creating a deep region (depth of more than 200 nm) having a net n-type doping between, and continuous with, said n-wells, and further creating a p-region having a doping concentration lower than that of the sub-surface p-type semiconductor region.

The method of fabricating an electrically isolated high-voltage I/O nMOS transistor in the surface of p-type semiconductor material comprises the following process steps (analogous process steps apply for the fabrication of a PMOS transistor):

forming two nested pairs of non-conductive electrical isolation regions into the p-type semiconductor material, the inner pair defining the lateral boundaries of the nMOS transistor active area, and the outer pair defining the area between n-wells;

implanting p-doping or n-doping ions to adjust the background doping level of the sub-surface region of the p-type semiconductor material; after the background doping adjustment implant, the p-type semiconductor has a peak doping concentration between 4·10E17 and 1·10E18 cm−3;

forming n-wells into the adjusted p-type semiconductor material;

depositing over the surface a layer of insulating material suitable as gate dielectric, covering the transistor area;

depositing a layer of poly-silicon or other conductive material onto the insulating layer;

protecting a portion of the poly-silicon and etching the remainder thereof, defining the gate area of the transistor;

depositing a first photoresist layer and opening a window therein, exposing the surface of the area between the outer isolation regions;

implanting, at low energy, n-doping ions into the exposed surface area, creating shallow n-doped layers (depth between 10 and 50 nm) under the surface (peak concentration from about 5·10E17 to 5·10E20 cm−3), suitable as extended source and drain of the transistor;

implanting, at high energy (400 to 700 keV) and high dose 8·10E12 to 8·10E13 cm−2), n-doping ions into the exposed surface area, creating a deep region (depth more than 200 nm) under the surface having a net n-type doping between, and continuous with, the n-wells; the peak concentration of the implanted ions is at a different depth than that of the p-type semiconductor in order to overcompensate the p-type doping and to create the region of the opposite conductivity type;

and further creating a p-region having a doping concentration lower than that of the adjusted sub-surface p-type semiconductor region (peak concentration of about 1 to 6 E1017 cm−3 below the p-n junctions of the deep source and drain regions;

removing the first photoresist layer;

depositing conformal insulating layers of an insulator, such as silicon nitride or silicon dioxide, over the surface and directional plasma etching the insulating layers so that only side walls around the poly-silicon gate remain;

depositing a second photoresist layer and opening a window therein, exposing the surface of the area between the outer isolation regions;

implanting, at medium energy, n-doping ions into the exposed surface area, creating an n-doped region (peak concentration from about 5·10E19 to 5·10E20 cm−3) that extends to a medium depth (between 50 and 20 nm) under said surface, suitable as deep source and drain of the transistor;

removing the second photoresist layer; and forming an electrical contact region to the p-region of lower doping concentration.

If desirable, an additional process step can be added after the high-energy n-type implant in order to control precisely the location, peak and depth of the buried layer:

implanting, at high energy and low dose, p-doping ions.

Dependent on the depth of the buried n-type layer from the surface, the method of forming the electrical contact is selected from the following processes:

Forming a p+-region as contact region to the isolated p-type region close to, but electrically isolated from the source of the nMOS transistor; or Forming a body-tied source providing a dual-function contact region to the nMOS transistor source and to the electrically isolated near-surface portion of the isolated p-type region; or Forming an angular-structured gate, configured to include an H-shape or a T-shape such that its directly adjacent regions provide contacts to the source, drain and near-surface portion of the isolated p-type region.

For fabricating a pMOS transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the method may comprise steps of annealing the high and/or medium energy implants at elevated temperature. As another example, the process steps may be modified by implanting the n-doping ions at high energy after the process step of implanting the n-doping ions at medium energy when the buried layer is shallow. It is therefore intended that the appended claims encompass any such modifications or embodiments.

We claim:

1. A method of fabricating a buried n-type layer connecting two n-wells in a p-type semiconductor region, electrically isolating the near-surface p-type semiconductor portion suitable for fabricating a high-voltage I/O nMOS transistor, comprising the steps of:

depositing a photoresist layer over the surface of said p-type semiconductor region, arid opening a window in said layer, exposing the surface area between said n-wells;

implanting, at low energy, n-doping ions through said window, creating shallow n-doped layers under said surface, suitable as extended source and drain of said transistor; and implanting, at high energy and high dose, n-doping ions into said p-type semiconductor through said window, creating a deep region having a net n-type doping between, and continuous with, said n-wells, and further creating a near-surface p-region having a doping concentration lower than that of the remainder of said p-type semiconductor region.

2. A method of fabricating an electrically isolated high-voltage I/O nMOS transistor in the surface of p-type semiconductor material, comprising the steps of:

forming two nested pairs of non-conductive electrical isolation regions into said p-type semiconductor material, the inner pair defining the lateral boundaries of said nMOS transistor active area, and the outer pair defining the area between n-wells;

implanting p-doping or n-doping ions to adjust the background doping level of the sub-surface region of said p-type semiconductor material;

forming n-wells into said adjusted p-type semiconductor material;

depositing over said surface a layer of insulating material suitable as gate dielectric, covering said transistor area;

depositing a layer of poly-silicon or other conductive material onto said insulating layer;

protecting a portion of said poly-silicon and etching the remainder thereof, defining the gate area of said transistor;

depositing a first photoresist layer and opening a window therein, exposing the surface of said area between said outer isolation regions;

implanting, at low energy, n-doping ions into said exposed surface area, creating shallow n-doped layers under said surface, suitable as extended source and drain of said transistor;

implanting, at high energy and high dose, n-doping ions into said exposed surface area, creating a deep region under said surface having a net n-type doping between, and continuous with, said n-wells, and further creating a p-region having a doping concentration lower than that of the remainder of said adjusted p-type region;

removing said first photoresist layer;

depositing conformal insulating layers of an insulator, such as silicon nitride or silicon dioxide, over said surface and directional plasma etching said insulating layers so that only side walls around the poly-silicon gate remain;

depositing a second photoresist layer and opening a window therein, exposing the surface of said area between said outer isolation regions;

implanting, at medium energy, n-doping ions into said exposed surface area, creating an n-doped region that extends to a medium depth under said surface, suitable as deep source and drain of said transistor;

removing said second photoresist layer; and forming an electrical contact region to said p-region of lower doping concentration.

3. The method according to claim 2 further including the process step of implanting, at high energy and low dose, p-doping ions for controlling the location and extent of said deep n-type region.

4. The method according to claim 2 further including the process step of forming a p+-region as said electrical contact region to said p-region of lower doping concentration, said p+-region located close to, but electrically isolated from, the source of said nMOS transistor.

5. The method according to claim 2 further including the process step of forming a body-tied source providing a dual-function contact region to said nMOS transistor source and to said electrically isolated near-surface portion of said semiconductor region.

6. The method according to claim 2 further including the process step of forming an angular-structured gate, configured to include an H-shape or a T-shape such that its directly adjacent regions provide contacts to said source, drain, and near-surface portion of said semiconductor region.

7. The method according to claim 2 wherein the thickness of said first photoresist layer is larger than a thickness solely required to block said low-energy ion implant.

8. The method according to claim 2 further comprising the step of annealing said high energy implant at elevated temperature.

9. The method according to claim 2 comprising the modified process step of implanting said n-doping ions at high energy after said process step of implanting said n-doping ions at medium energy.

10. The method according to claim 2 wherein said p-type semiconductor has a peak doping concentration between $4 \cdot 10E17$ and $1 \cdot 10E18 cm-3$ after said background doping adjustment implant.

11. The method according to claim 2 wherein said implanting of low energy ions comprises ions having an energy suitable for creating the Junction at a depth between 10 and 50 nm, and a peak concentration from about $5 \cdot 10E17$ to $5 \cdot 10E20$ cm−3.

12. The method according to claim 2 wherein said implanting of medium energy ions comprises ions having an energy suitable for creating the junction at a depth between 50 and 200 nm, and a peak concentration from about $5 \cdot 10E19$ to $5 \cdot 10E20$ cm−3.

13. The method according to claim 2 wherein said implanting of high energy ions comprises ions selected in the energy range from about 400 to 700 kev such that the peak concentration is at a different depth than that of the p-type semiconductor, and in the dose range of about 8·E12 to 8·10E13 cm−2 to overcompensate the p-type semiconductor doping and to create a region of the opposite conductivity type at a depth of more than 200 nm.

14. The method according to claim 2 wherein said net p-type doping of low concentration comprises a peak concentration of about 1 to 6 E17 cm−3 below the p-n junctions of said transistor's deep source and drain regions.

15. A method of fabricating a buried p-type layer connecting two p-wells in an n-type semiconductor region, electrically isolating the near-surface n-type semiconductor portion suitable for fabricating a high-voltage I/O pMOS transistor, comprising the steps of:

depositing a photoresist layer over the surface of said n-type semiconductor region, and opening a window in said layer, exposing the surface area between said p-wells;

implanting, at low energy, p-doping ions through said window, creating shallow p-doped layers under said surface, suitable as extended source and drain of said transistor; and implanting, at high energy and high dose, p-doping ions into said n-type semiconductor through said window, creating a deep region having a net p-type doping between, and continuous with, said p-wells, and further creating a near-surface n-region having a doping concentration lower than that of the remainder of said n-type semiconductor region.

16. A method of fabricating an electrically isolated high-voltage I/O pMOS transistor in the surface of n-type semiconductor material, comprising the steps of:

forming two nested pairs of non-conductive electrical isolation regions into said n-type semiconductor material, the inner pair defining the lateral boundaries of said pMOS transistor active area, and the outer pair defining the area between p-wells;

implanting n-doping or p-doping ions to adjust the background doping level of the sub-surface region of said n-type semiconductor material;

forming said p-wells into said adjusted n-type semiconductor material;

depositing over said surface a layer of insulating material suitable as gate dielectric, covering said transistor area;

depositing a layer of poly-silicon or other conductive material onto said insulating layer;

protecting a portion of said poly-silicon and etching the remainder thereof, defining the gate area of said transistor;

depositing a first photoresist layer and opening a window therein, exposing the surface of said area between said outer isolation regions;

implanting, at low energy, p-doping ions into said exposed surface area, creating shallow p-doped layers under said surface, suitable as extended source and drain of said transistor;

implanting, at high energy arid high dose, p-doping ions into said exposed surface area, creating a deep region under said surface having a net p-type doping between, and continuous with, said p-wells, and further creating an n-region having a doping concentration lower than that of the remainder of said adjusted n-type region;

removing said first photoresist layer;

depositing conformal insulating layers of an insulator, such as silicon nitride or silicon dioxide, over said surface and directional plasma etching said insulating layers so that only side walls around the poly-silicon gate remain;

depositing a second photoresist layer and opening a window therein, exposing the surface of said area between outer isolation regions;

implanting, at medium energy, p-doping ions into said exposed surface area, creating a p-doped region that extends to a medium depth under said surface, suitable as deep source and drain of said transistor;

removing said second photoresist layer; and forming an electrical contact region to said n-region of lower doping concentration.

17. The method according to claim 16 further including the process step of implanting, and high energy and low dose, n-doping ions for controlling the location and extent of said deep p-type region.

18. The method according to claim 16 further including the process step of forming a n+-region as said electrical contact region to said n-region of lower doping concentration, said n+-region located close to, but electrically isolated from, the source of said pMOS transistor.

19. The method according to claim 16 further including the process step of forming a body-tied source providing a dual-function contact region to said pMOS transistor source and to said electrically isolated near-surface portion of said semiconductor region.

20. The method according to claim 16 further including the process step of forming an angular-structured gate, configured to include an H-shape or a T-shape such that its directly adjacent regions provide contacts to said source, drain, and near-surface portion of said semiconductor region.

21. The method according to claim 16 comprising the modified process step of implanting said p-doping ions at high energy after said process step of implanting said p-doping ions at medium energy.

22. The method according to claim 16 wherein said n-type semiconductor has a peak doping concentration between 4·10E17 and 1·10E18 cm−3 after said background doping adjustment implant.

23. The method according to claim 16 wherein said implanting of low energy ions comprises ions having an energy suitable for creating the junction at a depth between 10 and 50 nm, and a peak concentration from about 5·10E17 to 5·10E20 cm−3.

24. The method according to claim 16 wherein said implanting of medium energy ions comprises ions having an energy suitable for creating the junction at a depth between 50 and 200 nm, and a peak concentration from about 5·10E19 to 5·10E20 cm−3.

25. The method according to claim 16 wherein said implanting of high energy ions comprises ions selected in the energy range from about 400 to 700 keV such that the peak concentration is at a different depth than that of the n-type semiconductor1 and in the dose range of about 8·10E12 to 8·10E13 cm−2 to overcompensate the n-type semiconductor doping and to create a region of the opposite conductivity type at a depth of more than 200 nm.

* * * * *